(12) United States Patent
Zarganis et al.

(10) Patent No.: US 7,259,969 B2
(45) Date of Patent: Aug. 21, 2007

(54) METHODS AND DEVICES FOR CONNECTING AND GROUNDING AN EMI SHIELD TO A PRINTED CIRCUIT BOARD

(75) Inventors: John Zarganis, Redwood City, CA (US); Rocky R. Arnold, San Carlos, CA (US)

(73) Assignee: WaveZero, Inc., Sunnyvale, CA (US)

( * ) Notice: Subject to any disclaimer, the term of this patent is extended or adjusted under 35 U.S.C. 154(b) by 339 days.

(21) Appl. No.: 10/789,176

(22) Filed: Feb. 26, 2004

(65) Prior Publication Data

US 2006/0134982 A1    Jun. 22, 2006

Related U.S. Application Data

(60) Provisional application No. 60/452,678, filed on Mar. 10, 2003, provisional application No. 60/449,934, filed on Feb. 26, 2003.

(51) Int. Cl.
*H05K 7/14* (2006.01)
(52) U.S. Cl. .......................... 361/800; 174/377
(58) Field of Classification Search ........... 361/800, 361/816, 818, 753; 174/377, 384, 387
See application file for complete search history.

(56) References Cited

U.S. PATENT DOCUMENTS

| | | | |
|---|---|---|---|
| 5,428,508 A | 6/1995 | Pronto | |
| 5,704,117 A | 1/1998 | Mok et al. | |
| 5,717,577 A | 2/1998 | Mendolia et al. | |
| 5,761,053 A * | 6/1998 | King et al. | 361/818 |
| 6,049,469 A | 4/2000 | Hood, III et al. | |
| 6,239,359 B1 | 5/2001 | Lilienthal, II et al. | |
| 6,275,683 B1 | 8/2001 | Smith | |
| 6,377,475 B1 | 4/2002 | Reis | |
| 6,426,881 B1 | 7/2002 | Kurz | |
| 6,485,595 B1 * | 11/2002 | Yenni, Jr. et al. | 156/221 |
| 6,683,245 B1 * | 1/2004 | Ogawa et al. | 174/382 |
| 6,744,640 B2 * | 6/2004 | Reis et al. | 361/818 |
| 6,870,091 B2 * | 3/2005 | Seidler | 174/382 |
| 6,928,719 B2 * | 8/2005 | Kim et al. | 29/594 |
| 2002/0003695 A1 | 1/2002 | Spratte et al. | |

* cited by examiner

*Primary Examiner*—Thanh-Tam Le
(74) *Attorney, Agent, or Firm*—Townsend and Townsend and Crew LLP

(57) ABSTRACT

The present invention provides electronic devices, kits, and connector assemblies for coupling an EMI shield to a ground trace. In one embodiment, the present invention provides an electronic device comprising a printed circuit board and an EMI shield that has a flange around at least a portion of a perimeter of the EMI shield. One or more connectors coupled to the flange removably contact the flange to a ground trace of the printed circuit board.

19 Claims, 10 Drawing Sheets

METHODS AND DEVICES FOR CONNECTING AND GROUNDING AN EMI SHIELD TO A PRINTED CIRCUIT BOARD

CROSS-REFERENCES TO RELATED APPLICATIONS

The present application claims benefit to U.S. Provisional Patent Application Ser. No. 60/449,934, filed Feb. 26, 2003 and U.S. Provisional Patent Application Ser. No. 60/452,678, filed Mar. 10, 2003, the complete disclosures of which are incorporated herein by reference.

BACKGROUND OF THE INVENTION

The present invention relates generally to methods of connecting an electromagnetic interference (EMI) shield to a printed circuit board (PCB) of an electronic device. In particular, the present invention relates to different shield design techniques, features and the use of secondary connector components to efficiently and effectively connect one or more EMI shields to a printed circuit board.

All electronic products emit electromagnetic radiation, generally in the range of 50 MHz to 3 GHz, but not limited to this range, especially considering the recent advances in high-speed microprocessor design and the rapidly increasing capabilities of high-speed networking and switching. The problem of emittance of electromagnetic radiation is not new to designers of electronic equipment; indeed, significant efforts are taken to reduce electromagnetic interference, electrostatic discharge, radio frequency interference (hereinafter referred to collectively as "EMI") and virtually every country has a regulating agency (FCC in the U.S., for instance) that restricts the marketing and sale of electronic equipment that do not pass stringent requirements for EMI, whether radiation or intercepted (also called susceptibility) by an electronic device.

Present day solutions for EMI shielding generally include the use of conductively painted plastic housings, conductive gaskets, and metal cans that are affixed to the printed circuit board by soldering or similar methods, some of which are semi-permanently attached to the printed circuit board. In virtually all cases, however, the existing solutions are expensive and add significant costs to providing electronic equipment such as cellular phones, personal digital assistants (PDA), laptop computers, set-top boxes, cable modems, networking equipment including switches, bridges, and cross-connects, among a multitude of other electronic products.

In an effort to bring costs down while increasing EMI shielding, various technologies utilizing metallized polymer substrates have been developed for use as an effective EMI shielding solution. For example, U.S. Pat. No. 5,811,050 to Gabower, the complete disclosure of which is incorporated herein by reference, has provided a shielding approach wherein a thermoformable substrate (any number of polymers) is first thermoformed and then metallized. This approach offers the advantage of eliminating any stresses that may occur during thermoforming to a metallized layer that is applied to the substrate prior to the forming process. The product has been shown to be a highly effective and a relatively low-cost method for providing effective EMI control (also called electromagnetic compatibility or EMC) for electronic products.

Utilizing formed plastic shields that have been metallized has proven to be an effective shielding method that reduces the cost and overall weight associated with shielding of an electronic device. However, since a polymer substrate is used to create these types of EMI shields, some of the common methods used to attach and locate more traditional, metal EMI shielding solutions onto a printed circuit board are not applicable for polymer based shields. For instance, EMI shields in the form of "metal cans" are commonly soldered into place on a printed circuit board. Soldering is a method of heating a metal material or alloy, having a low melt temperature, until it reaches a molten state. The molten solder is then applied to both the metal shield and usually an exposed ground trace on the printed circuit board simultaneously. Once the solder cools and re-solidifies it creates both a mechanical and electrical connection between the EMI shield and the printed circuit board. Soldering achieves two goals, a soldered shield is physically located and retained in a desired orientation and location, and the solder connection effectively grounds the EMI shield, which is desirable for effective shielding.

However, if this same solder technique is used in conjunction with a metallized plastic shield, the heat from the molten solder would damage the plastic substrate and potentially compromise the shielding effectiveness of the EMI shield. Therefore, alternative shield design techniques, features and the use of secondary components to efficiently and effectively connect one or more EMI shields to a printed circuit board must be created.

BRIEF SUMMARY OF THE INVENTION

The present invention provides electronic devices having improved EMI shield assemblies, EMI shield kits, and connectors that may connect and/or ground an EMI shield to a printed circuit board in an electronic device.

In one aspect, the present invention provides a kit that has an EMI shield comprising a flange around at least a portion of a perimeter of the EMI shield and one or more connectors that are coupleable to the flange so as to removably couple the flange of the EMI shield to desired grounding portion(s) of the printed circuit board (e.g., a ground trace on the printed circuit board, grounding eyelets on the circuit board used for screws that connect the printed circuit board down onto an enclosure or supporting frame, or other grounding locations). The kit may optionally include instructions for use which recite the method for using the EMI shield and connector.

In another aspect, the present invention provides an electronic device. The electronic device comprises a printed circuit board and an EMI shield comprising a flange around at least a portion of the perimeter of the EMI shield. The EMI shield is removably coupled to the circuit board with one or more connectors that are coupled to the flange. Typically, the EMI shield is removably coupled to a grounding portion of the printed circuit board, such as a ground trace on the printed circuit board.

The EMI shields may comprise one or more compartments. As such, the EMI shield may take on a variety of shapes, sizes and forms so as to conform to the specific shape and configuration of the printed circuit board being shielded. For example, in one embodiment, the EMI shield comprises a top surface and a plurality of side walls. The flange extends laterally from the plurality of side walls and extends in a plane that is substantially parallel with a top surface of the printed circuit board.

The EMI shields may comprise a metallized polymer substrate. While metallized polymer EMI shield are preferred, it should be appreciated that the aspects of the present invention are not limited to the type EMI shield used, and the EMI shield may be a "metal can" or be any other conventional or proprietary EMI shield.

In the embodiments which use a metallized polymer substrate, the metallized polymer substrate may be shaped to form one or more compartments, and a flange around the perimeter using thermoforming or other conventional methods. Thereafter, the metal layer may be deposited onto an inner and/or outer surface of the shaped substrate.

The connectors of the present invention may be conductive or non-conductive and may be fixedly attached or removably attached to the flange of the EMI shield. In one configuration, at least a portion of the connector is integrally formed in the flange or other desired portion of the EMI shield. In another configuration, at least a portion of the connector is fixedly attached to a grounding portion on the printed circuit board (e.g., a ground trace) and is removably attachable to the flange or sidewall of the EMI shield. In yet another configuration, the connector is removably attached to at least one of the flange of the EMI shield and the grounding portion on the printed circuit board.

The connector may comprise a conductive or non-conductive adhesive that is coupleable to the flange of the EMI shield. The adhesive, in the form of a tape, discrete deposits of adhesive, a continuous deposit of adhesive and the like, may be place directly on the flange or it may be placed directly on a target portion of the printed circuit board (e.g., over at least a portion of the ground trace). In some configurations, the adhesive may be deposited in a groove or other trough in the printed circuit board or on the flange of the EMI shield.

In another embodiment, the connectors comprise a one or more removable mechanical connectors. The connectors are sized and shaped to be inserted into apertures in both the flange of the EMI shield and apertures in the printed circuit board so as to releasably attach the flange of the EMI shield to a grounding portion of the printed circuit board (e.g., ground trace). The connectors may be coupled along an elongated surface of the flange or the connectors may be coupled to the corners of the EMI shield.

In one particular configuration, the removable mechanical connectors comprise a first and second arm that are positioned substantially orthogonal to each other. The shaped ends or fingers of the first and second arm are sized and shaped to be inserted into the apertures in the EMI shield and the printed circuit board.

In another configuration, the removable mechanical connector comprise a curved, elongated body that has ends that are sized and shaped to enter apertures in the EMI shield and the printed circuit board. To attach the EMI shield to the printed circuit board, a force is applied to the curved mechanical connector to straighten the elongate body and align the ends of the curved elongate body with the apertures in the EMI shield. As a result of the curvature of the elongate body, the natural spring force creates tension and friction between the ends of the connector and the apertures of the printed circuit board. The tension and friction keep the flexible connector straight and maintains pressure across the entire flange of the EMI shield to secure the connector (and EMI shield) in place. Optionally, the curved elongate body may comprise a plurality of contact points, such that when the curved connector is straightened, the contact points contact the surface of the flange and apply a substantially even force along the flange.

In another embodiment, the connectors are integrally formed in the flange of the EMI shield. The connectors may be formed as protrusions which extend from the flange toward the printed circuit board. As can be appreciated, in other embodiments, the connectors may protrude away from the surface of the printed circuit board and may interact with a male connector on the printed circuit board or with another EMI shield, so as to connect the EMI shield to the printed circuit board.

In yet another embodiment, the connector comprises one or more conductive mechanical clips that are fixedly coupled to at least a portion of the ground trace of the printed circuit board with a conductive adhesive or solder. The mechanical clips may releasably couple the EMI shield to a grounding portion of the printed circuit board (e.g., a ground trace) so as to allow for easy removal of the EMI shield from the grounding portion. In one configuration, the conducive mechanical clips comprise a body that has first and second opposing arms. A portion of the EMI shield, such as the flange or sidewall, is received between the first and second arms and are mechanically and electrically coupled to the grounding portion of the printed circuit board.

In another embodiment, the mechanical clip connectors may be fixedly attached to the printed circuit board adjacent the ground trace so as to releasably press a flange of the EMI shield to the ground trace. In such configurations, the mechanical clip connectors are usually non-conductive.

In another aspect, the present invention provides an electronic device. The electronic device comprises a printed circuit board and an EMI shield. The EMI shield may be in the form of a first portion and a second portion, or in the form of a clamshell shield that comprises a first portion coupled to the second portion with a hinge. The first portion may be configured to be positioned on a first side of the printed circuit board and the second portion may be configured to be positioned on a second side of the printed circuit board. The first and second portion will have integral or removable connectors on a portion of the shields (e.g., a flange) that allow the first and second portions to be coupled to the opposing sides of the printed circuit board. For example, any of the connectors recited herein may be used to mechanically and/or electrically connect the first portion and second portion of the EMI shield to the printed circuit board.

In one particular configuration of the two-part/hinged EMI shield, the first portion of the EMI shield comprises one or more male connector (e.g., a protrusion) along at least a portion of the flange. The second portion of the EMI shield comprises one or more female connector along a corresponding portion of the flange that substantially corresponds in shape, size and position of the male connector on the first portion. The printed circuit board may comprise one or more apertures that correspond to the position of the male connector, such that when the first portion of the EMI shield is properly positioned to shield the electronic components on the first side of the printed circuit board, the protrusions are insertable into the apertures in the printed circuit board. The second portion of the EMI shield may then be positioned along the second side of the printed circuit board so that the female connector mates with the male connectors that protrude through the apertures. By "snapping" together or otherwise connecting the male and female connectors, the first and second portions of the EMI shield will be coupled to the printed circuit board and both sides of the printed circuit board may be shielded. If desired, the aperture will be a conductive grounding aperture and/or positioned within the ground trace such that when the protrusions (which may be metallized as well) extend through the apertures, the first and second portions are grounded.

In another aspect, the present invention provides an EMI shield. The EMI shield includes a body, (e.g., a metallized polymer) comprising an upper surface that includes one or more features, a plurality of sidewalls that extend from the top surface, and a flange that extends laterally away from the sidewalls. The features on the top surface are shaped to interact with an inner surface of a housing of an electronic device when the housing is around the printed circuit board so as to compress the flange of the metallized polymer against a grounding portion on the printed circuit board, such as a ground trace on the printed circuit board.

In a further aspect, the present invention provides an electronic device. The electronic device has a printed circuit board that comprises an electronic component and a ground trace that at least partially surrounds the electronic component. The electronic device further includes an EMI shield that comprises an upper surface that includes one or more features, a plurality of sidewalls that extend from the top surface, and a flange that extends in a direction substantially parallel to a surface of the printed circuit board. The EMI shield is coupleable to the ground trace on the printed circuit board. A housing of the electronic device is configured to enclose the printed circuit board and EMI shield so that the features on the top surface interact with an inner surface of the housing. Such interaction compresses the flange of the EMI shield against a ground portion on the printed circuit board, such as the ground trace on the printed circuit board.

In one embodiment, the features on the top surface of the EMI shield are semi-circular protrusions that extend from the top surface toward the inner surface of the housing. As can be appreciated, the features may take on a variety of other shapes. For example, the features may be oval, v-shaped, grooves, diamonds, and the like. The features may be positioned anywhere along the surface of the EMI shield. Typically, however, there are some features that are positioned substantially over a sidewall of the EMI shield so as to provide a compression force down the sidewall and onto the flange. The features on the top surface of the EMI shield may have the same heights and shape or different heights and shape.

Optionally, the EMI shields may include one or more features that extend from the flange toward the printed circuit board so as to interact with a corresponding feature on the printed circuit board (e.g., aperture or groove) so as to locate and retain the EMI shield with the ground trace. The feature on the printed circuit board may be located adjacent the ground trace or within the ground trace, if desired. As another optional feature, the EMI shield may comprise cavities that receive ribs from the housing of the electronic device.

In yet another aspect, the present invention provides a kit. The kit comprises an EMI shield comprising a top surface and a plurality of side walls and a conductive connector assembly that is configured to be fixedly connected to a ground trace of a printed circuit board. The conductive connector assembly is configured to releasably couple the EMI shield to the ground trace. The conductive connector assembly provides an electrical and mechanical connection between the EMI shield and a grounding portion of the printed circuit board, such as a ground trace. The kit may optionally include instructions for use which recite a method of using the EMI shield and connector assembly.

In a further aspect, the present invention provides an electronic device. The electronic device comprises a printed circuit board comprising an electronic component and a grounding portion, such as a ground trace. The electronic device further includes an EMI shield that comprises a top surface and a plurality of side walls. The conductive connector assembly is fixedly attached to the grounding portion and releasably couples the EMI shield to the grounding portion.

The conductive connector assembly may comprise one or more clips that are fixedly attached to the ground trace with a solder or a conductive adhesive. In one configuration the conductive connector assembly comprises a body that has first and second opposed arms. The opposed arms may be configured to be releasably attached to a sidewall or a flange of the EMI shield. The opposite sides of the portion of the shield will be "pinched" or otherwise held by the opposed arms so as to create a mechanical and electrical bond between the EMI shield and the grounding portion.

A further understanding of the nature and advantages of the invention will become apparent by reference to the remaining portions of the specification and drawings.

on the printed circuit board to retain and locate the EMI shield on the printed circuit board.

Figure 14:
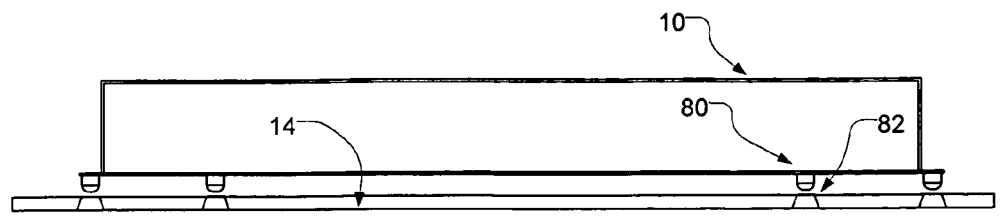

FIG. 14 illustrate one particular tongue and groove embodiment that attaches the EMI shield to the printed circuit board.

Figure 15:
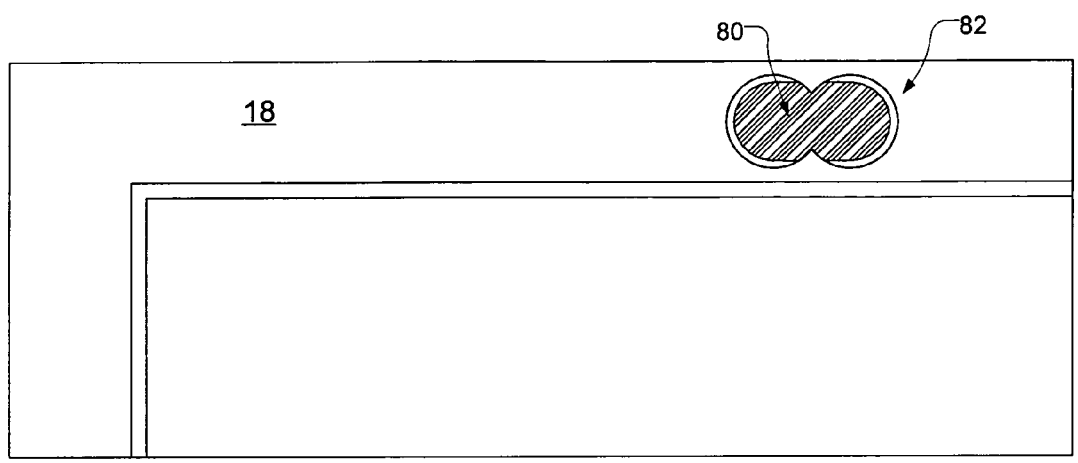

FIG. 15 is a bottom view of a tongue feature being pinched by a groove in the printed circuit board.

Figure 16:
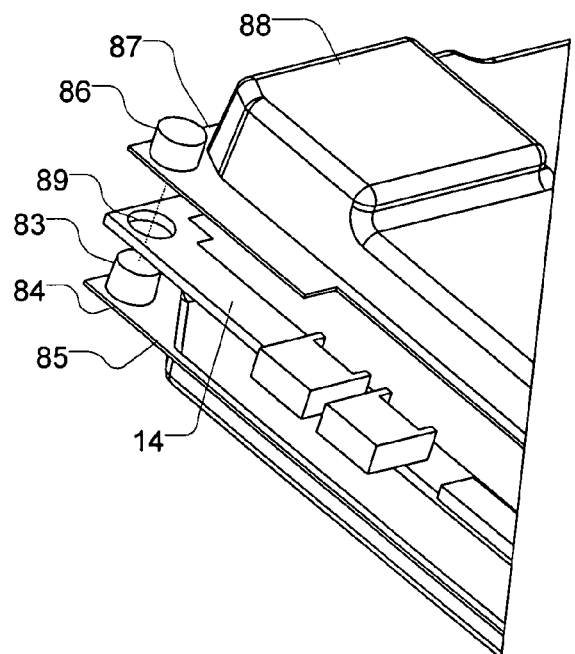

FIG. 16 is a partial view of a first EMI shield and a second EMI shield coupled to opposite sides of the printed circuit board with mating female and male connectors.

Figure 17:
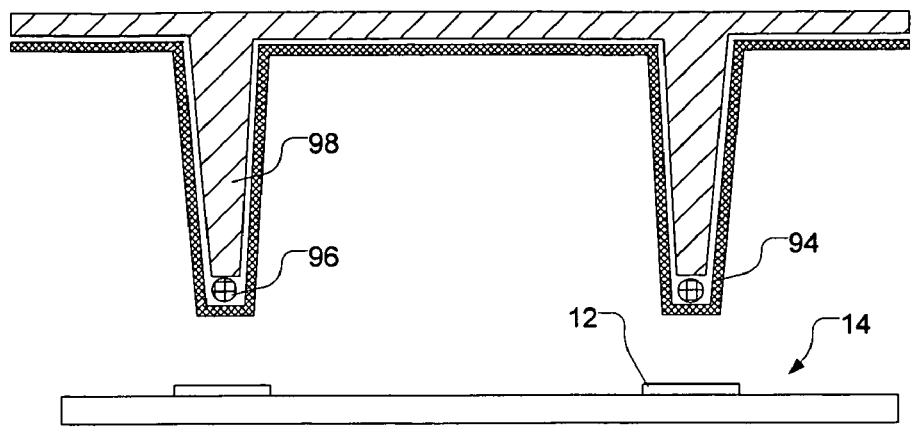

FIG. 17 illustrates a gasket positioned between an EMI shield and ribs of an outer housing.

Figure 18:
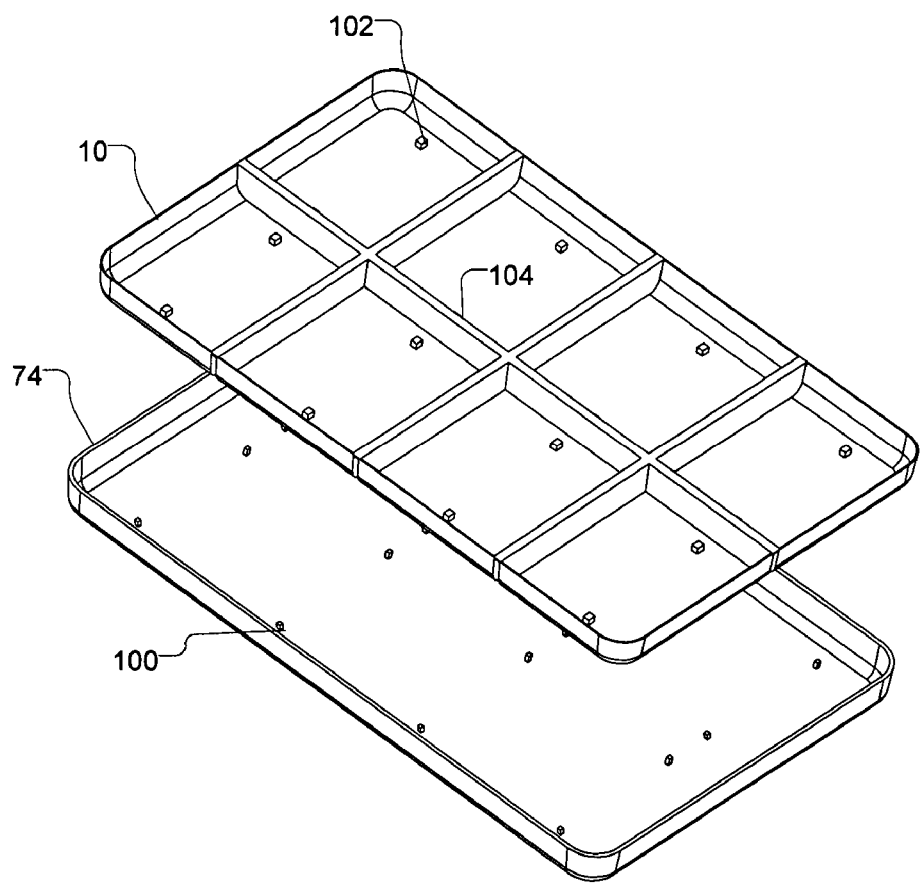

FIG. 18 illustrates an outer housing that comprises male locators that interact with female locators on the EMI shield.

Figure 19:
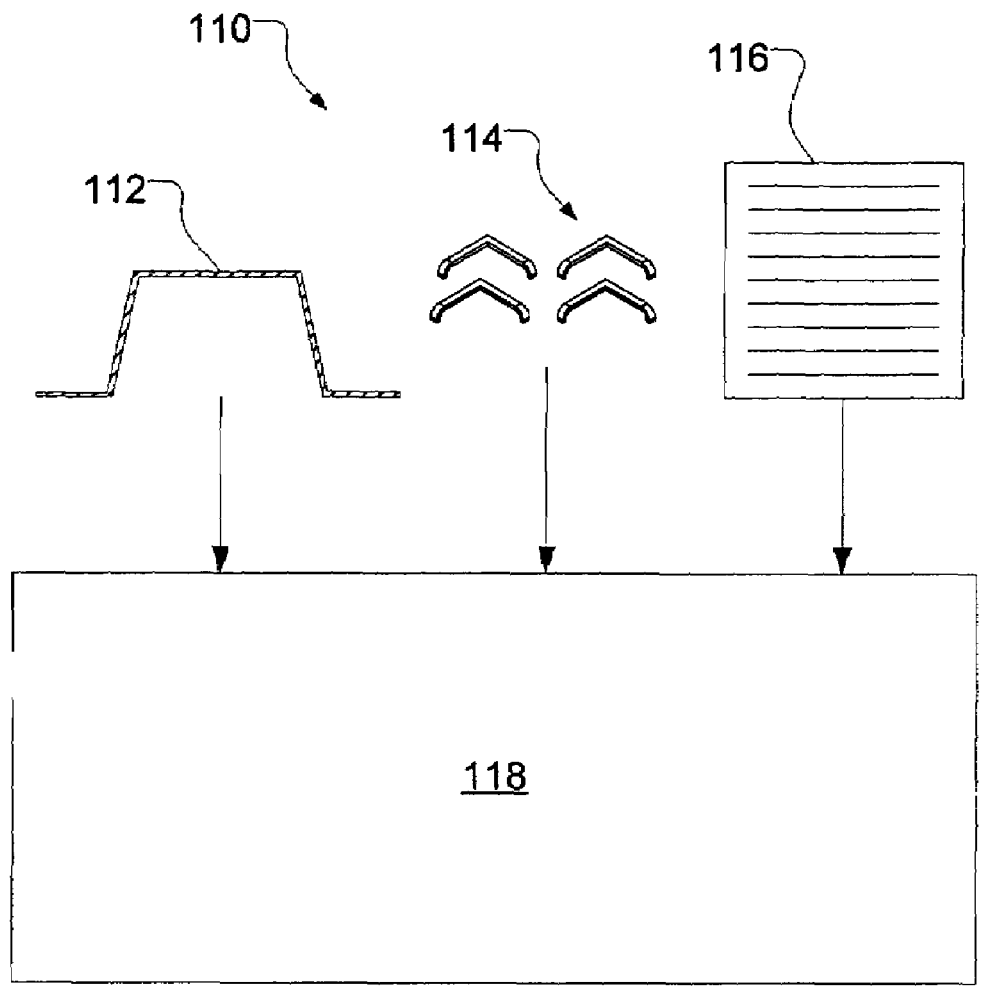

FIG. 19 illustrates a kit encompassed by the present invention.

DETAILED DESCRIPTION OF THE INVENTION

The present invention provides methods and assemblies for connecting and grounding an electromagnetic interference (EMI) shield to a printed circuit board (PCB) of an electronic device.

The EMI shields of the present invention typically include a resin film layer that can be formed by a variety of plastic processing methods to a desired shape to partially or fully enclose a printed circuit board and the electronic components on the printed circuit board. In exemplary embodiments, the resin film layer is a thermoformable plastic that is shaped using thermoforming techniques (e.g., vacuum, pressure, or mechanical forces). It should be appreciated however, that the resin film layer can be shaped using any conventional or proprietary methods. The resin film layer of the EMI shield typically has at least one metal layer on at least one side of the resin film layer. The metal layers will have a thickness that is sufficient to block the transmission of EMI, typically between about 1 micron and about 50 microns.

The metal layers of the present invention are typically applied to the resin film layer after shaping of the resin film layer. If the metal layer is applied prior to shaping of the resin film layer, the shaping process (e.g., thermoforming) tends to stretch out and weaken portions of the metal layer. Such stretching and thinning has been found to weaken and sometimes destroy the EMI shielding capabilities of the metal layer. The EMI shields of the present invention will generally have a substantially even thickness in the metal layer that is sufficient to block the passage of EMI. A more detailed description of some embodiments of an EMI shield that may be used with the present invention is described in commonly owned U.S. Pat. No. 5,811,050 and commonly owned U.S. patent application Ser. No. 09/788,263, filed Feb. 16, 2001, U.S. patent application Ser. No. 09/947,229, filed Sep. 4, 2001, U.S. patent application Ser. No. 09/685,969, filed Oct. 10, 2000, and PCT Patent Application No. 00/27610, filed Oct. 6, 2000, the complete disclosures of which are incorporated herein by reference.

Typically, the metal film layer is deposited onto one or more surfaces of the resin film layer using vacuum metallization. Vacuum metallization is one preferred method because of the substantially even layer of metal that can be applied to the shaped resin film layer to create the EMI shield. It should be appreciated however, that other methods of depositing the metal layer to the substrate could be used without departing from the scope of the present invention. For example, instead of vacuum metallization, other methods such as a depositing a random mat or fiber weave, sputtering, painting, electroplating, deposition coating, electroless plating, laminated conductive layers, and the like, may be used to deposit the metal layer onto the shaped resin film layer. Typically, the metal layer will have a thickness between approximately 1 microns and 50 microns. In such embodiments, the metal layer will typically be grounded with a grounding portion of the printed circuit board so as to create a Faraday cage.

As can be appreciated, while metallized thermoform shields are preferred, the connection methods and connector assemblies of the present invention are equally applicable to conventional metal cans and other conventional or proprietary EMI shields, and the present invention should not be limited to the particular EMI shields described herein.

In many embodiments of the present invention, the connectors allow for removable attachment of a flange of the EMI shield with a grounding portion on the printed circuit board. As can be appreciated, while the figures illustrate electrical and mechanical connection between a ground trace that extends around a perimeter of the electronic component, the present invention is not limited to such a grounding configuration. For example, the EMI shields of the present invention may be grounded to grounding trace that does not extend around the entire perimeter of the electronic component, to a grounding eyelets on the printed circuit board used for screws that connect the printed circuit board down onto an enclosure or supporting frame, or other conventional grounding locations.

Figure 1:
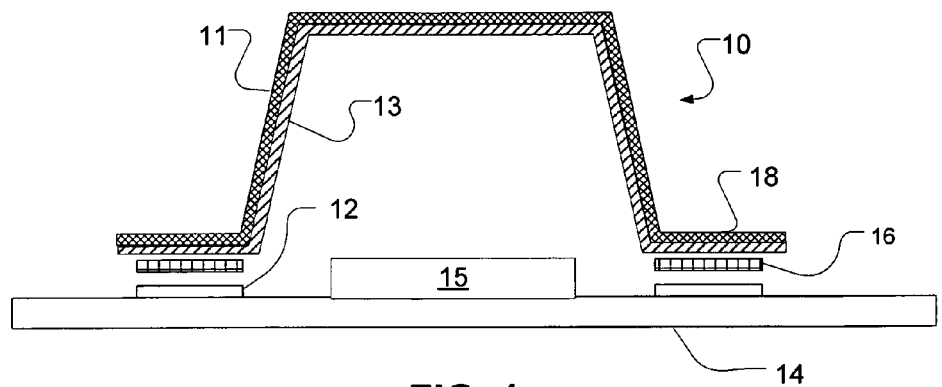
FIG. 1 is a simplified cross sectional, exploded view of an EMI shield being attached to a printed circuit board by an adhesive.

Referring now to FIG. 1, an EMI shield 10 that comprises a shaped polymer film layer 11 and one or more metal layers 13. EMI shield 10 may be attached to a ground trace 12 on the printed circuit board (PCB) 14 using a connector. In one embodiment, the connector mechanically and electrically connects the EMI shield 10 with the ground trace 12 so that an electronic component 15 is housed within the confines of the EMI shield 10. One connector of the present invention may take the form of a pressure sensitive adhesive 16 that is positioned on desired portions of the EMI shield 10. Adhesive 16 may be conductive or non-conductive. The adhesive 16 retains the desired location and position of the EMI shield 10 against ground trace 12. In the illustrated configuration, the adhesive 16 is a "double sided" tape and attached to a lateral flange 18 that extends around a periphery of the EMI shield 10. While not shown, adhesive 16 may also be coupled to internal walls of the EMI shield (if any), and the like.

The adhesiveness of adhesive 16 may be chosen to have an adhesiveness that is sufficient to maintain the position of the EMI shield on the printed circuit board, yet allow for manual removal and replacement of the EMI shield back onto the printed circuit board. In other embodiments, adhesive 16 may have an adhesiveness that substantially permanently adheres the EMI shield on the ground trace 12. One exemplary adhesive that may be used is 3M® PSA adhesive (3M part numbers 9713 and 9703)

In preferred embodiments, the double-sided adhesive 16 is intrinsically conductive so as to mechanically retain the location of the EMI shield 10 and also provide an electrical coupling to the ground trace 12 thereby improving the EMI shielding performance. As can be appreciated, the shape and size of the EMI shield may be formed in such a way that the flanges 18 around the perimeter, any internal walls of the EMI shield, and the shape of conductive adhesive 16 match the design of the exposed printed circuit board ground trace 12 for easy alignment and placement of the shield and improved grounding and shielding performance.

The double-sided adhesive may be in the form of pre-cut adhesive strips or the double-sided adhesive may be dispensed onto the ground trace or the EMI shield using a silk-screening or pad printing process. The double-sided adhesive 16 may be applied in a variety of different methods. For example, in one method, the double-sided adhesive may be applied to the flange (and other portions of the EMI shield) and thereafter the EMI shield may be robotically or manually placed onto the ground trace. Alternatively, the double-sided adhesive may be applied to the ground trace and thereafter the EMI shield may be robotically or manually placed onto the double-sided adhesive.

Figure 1A:
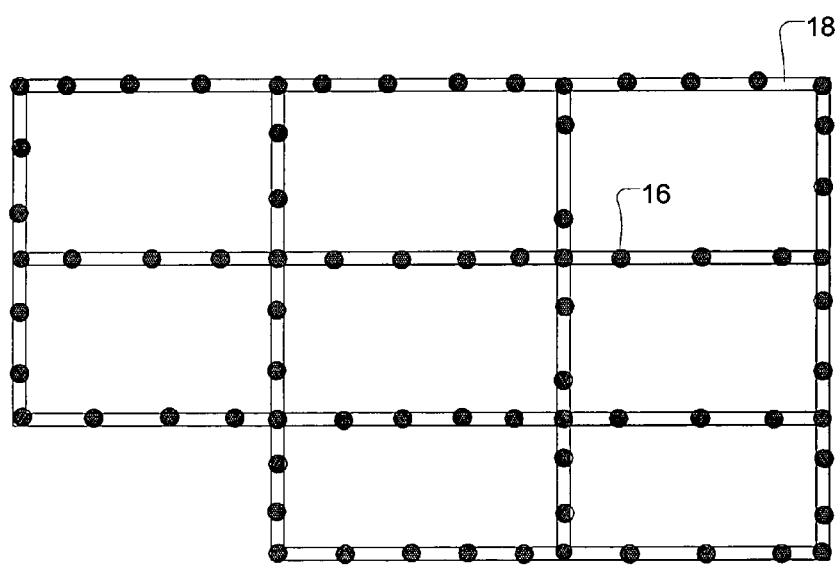
FIG. 1A illustrates an underside of an EMI shield that has a plurality of discrete adhesive spots on the flange and inner walls of the EMI shield.
Figure 1B:
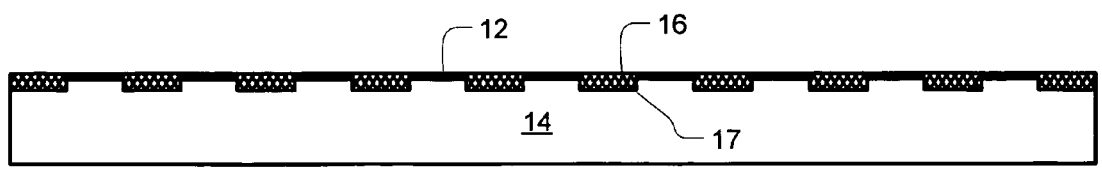
FIG. 1B is a sectional view of a printed circuit board having grooves for receiving an adhesive.
Figure 1C:
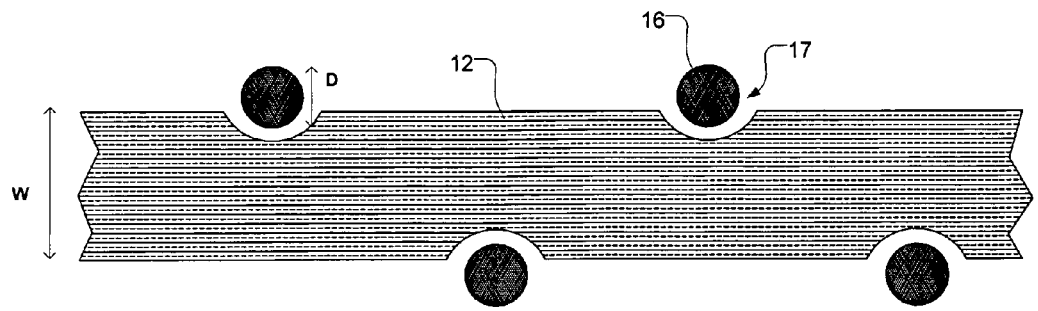
FIG. 1C is a top view of a ground trace and a plurality of discrete adhesives.

Referring now to FIGS. 1A to 1C, the adhesive 16 may be positioned in a variety of different positions to couple the EMI shield 10 to a ground trace 12 on the printed circuit board 14. For example, in FIG. 1A, the adhesive takes the form of discrete deposits of adhesive 16 that may be placed on an underside of the flange 18 of the EMI shield 10 in any desired spaced configuration using any desired method. The adhesives may be dispensed, either manually of robotically, through a syringe in either a continuous bead or in droplets at desired locations and frequency. Alternatively, the adhesive can be silk-screened onto the flanges of the shield.

If the adhesive is placed as droplets, the spacing between the adhesive droplets may vary depending on the applications, shield designs and operating frequency of the electronic device. Typically, an adhesive spacing is used that provides adequate mechanical connection between the shield and the printed circuit board using a minimal amount of adhesive, while still providing a sufficient electrical connection. If the adhesive is spaced too far apart, more offending EMI noise may leak out from under the EMI shield especially at the higher frequencies. Higher frequencies have smaller wavelengths that can leak out of smaller openings. Therefore, for higher frequencies, the adhesive droplets are placed closer together.

While not shown, in some embodiments dimples are formed in the flange 18 of the shield 10 in order to act like a recess or reservoir for any excess adhesive to flow into and collect. A flat flange may inadvertently force the adhesive away from the shield and spread the adhesive into other components. With conductive adhesive, this could cause short circuits on the printed circuit board. Therefore, the spacing of the droplets and dimples, and the design of the flange needs to be taken into consideration for each individual design.

Alternatively, as shown in FIG. 1B, the printed circuit board 14 may be etched, drilled or machined into the printed circuit board. The grooves may be created with a thick solder mask to create a plurality of discrete grooves 17 in the printed circuit board 14. Grooves 17 are sized and shaped to receive a sufficient amount of adhesive 16 so as to be able to reliably couple the metal layer 13 on flange 18 of the EMI shield 10 to the ground trace 12. For smaller printed circuit boards, a 1 mm-2 mm wide groove is generally sufficient. The depth of the grooves cannot be very deep since the printed circuit board is usually only between 1 and 2 mm thick. The depth of the grooves should be as deep as possible to provide a "well" for the adhesive to flow into, retain its location, and direct any adhesive flow. In exemplary embodiments, the depth of these grooves is between about 0.25 mm and about 0.5 mm, but it can be larger or smaller, depending on the dimensions of the printed circuit board. Filling the grooves with adhesive 16 may be accomplished through the use of manual or robotic syringe dispensing, or by selectively screening the adhesive onto the printed circuit board prior to the application of the EMI Shield.

The grooves 17 may be positioned adjacent (and non-overlapping) with the ground trace. Alternatively, to reduce the footprint of the EMI shield 10, the grooves 17 may be positioned so as to partially "overlap" with at least a portion of the ground trace. For example, as shown in FIG. 1C, the grooves 17 may be circular and positioned so that the diameter D of the groove 17 substantially overlaps with a width W. As can be appreciated, the shape of the groove 17 and the size of the adhesive deposit may be any shape and may overlap the ground trace 12 any desired amount. In the illustrated embodiment, the adhesive is non-conductive, so that the adhesive 16 makes only a mechanical connection to the flange 18. Such a mechanical connection creates a mechanical and electrical contact between flange 18 and the ground trace 12.

Figure 2:
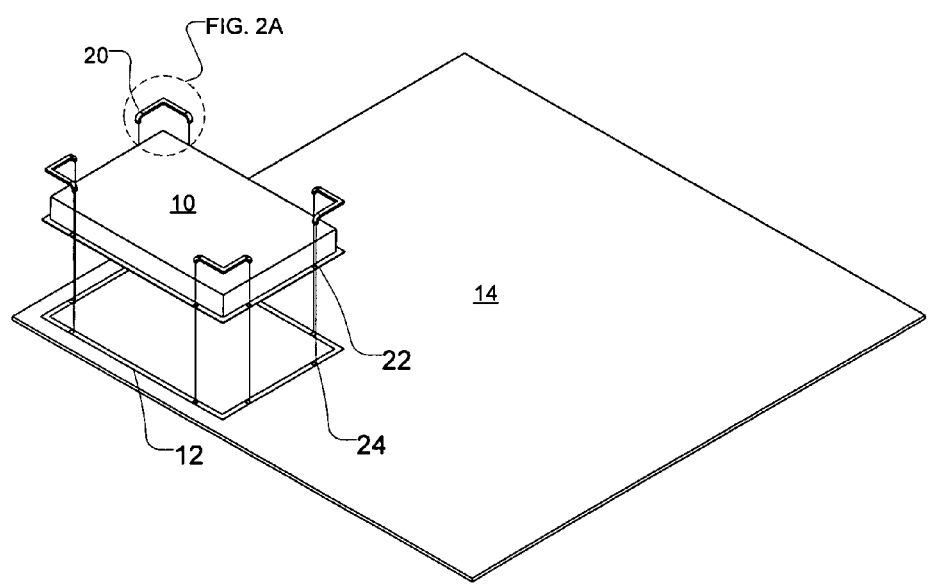
FIG. 2 is an exploded perspective view of an EMI shield located and retained in place on ground trace on a printed circuit board through the use of a plurality of mechanical connectors.
Figure 2A:
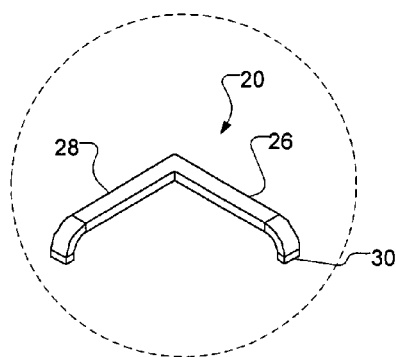
FIG. 2A illustrates one embodiment of a mechanical connector of FIG. 2 that is encompassed by the present invention.

Referring now to FIGS. 2 and 2A, alternatively or in addition to the adhesive 16, one or more mechanical connectors 20 may be used to facilitate grounding and attachment of an EMI shield 10 to ground trace 12 of printed circuit board 14. The mechanical connectors may be made of a non-conductive material (e.g., plastic) or a conductive material (e.g., metal).

These mechanical connectors 20 may pass through various apertures 22 in the EMI shield 10 and into the printed circuit board 14 so as to encourage a physical and electrical connection between an inner metal layer of EMI shield 10 and the ground trace 12. These mechanical connectors 20 may resemble screws, pins, staples, rivets, brackets or a plurality of other similar mechanical devices made from metal, plastic or other materials. The connectors 20 could be designed to either permanently affix the EMI shield to the printed circuit board or be designed for repeated removal and insertion of the EMI shield. The latter design feature may be desirable so that the EMI shield 10 could be repeatedly applied and removed in order to access the electronic components on the printed circuit board that are enclosed by the EMI shield without the use of a tool. As can be appreciated, electronic components on the printed circuit board may need to be serviced or repaired from time to time and therefore a repeatable and nondestructive method of attaching and removing the EMI shield 10 is desirable. The mechanical connectors 20 may manually or robotically be inserted through the apertures 22 in the shield and apertures 24 in the printed circuit board. Additional steps may be made to ensure the retention of the connectors and the electrical grounding connection between the EMI shield and the printed circuit board. These additional steps may include but should not be limited to soldering, ultrasonic welding, sintering, laser melting or the like.

FIG. 2A illustrates one exemplary mechanical connectors 20 that is encompassed by the present invention. Connector 20 includes a first arm 26 coupled to a second arm 28. Arms 26 and 28 are substantially perpendicular to each other. Each arm 26, 28 comprises a finger or curved protrusion 30 whose end is sized and shaped to be inserted through the apertures 22, 24. In use, the mechanical connectors are aligned with apertures 22, 24 and the protrusions 30 are inserted into the apertures until the EMI shield 10 is firmly positioned against the ground trace 12. It should be noted that the connector 20 shown in FIGS. 2 and 2A are configured to be inserted on a corner of a substantially rectangular EMI shield 10. As can be appreciated the mechanical connectors may be shaped to be inserted onto other portions of the EMI shield and positioned at other strategic locations.

Some preferred methods of coupling the connector 20 with the apertures 22 is through a press-fit (mechanical interference), a tension fit, or a tension snap fit. For the tension fit applications, the curved protrusions 30 extend through the aperture 22 in the EMI shield and corresponding aperture 24 in the printed circuit board. The protrusions 30 may be adapted to flex inward so as to be equal to or smaller than the diameter of the connector or corresponding aperture in the printed circuit board. Once through the thickness of the printed circuit board 14, the protrusions 30 could curve back outward and not allow the connector protrusions 30 to pass back through the printed circuit board aperture 24 without having the protrusions be flexed back inward.

Figure 3:
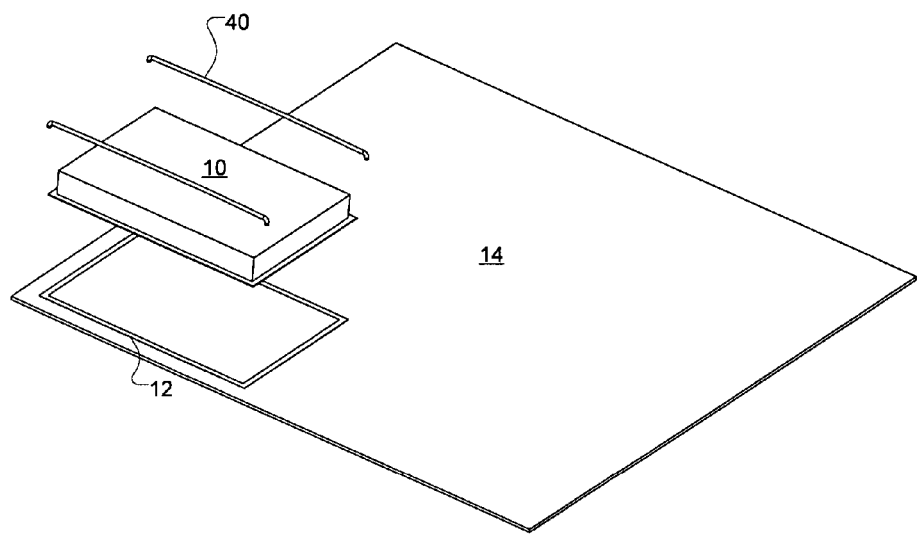
FIG. 3 is an exploded perspective view of an EMI shield that is located and retained in place on a printed circuit board through the use of a plurality of curved, flexible connectors.
Figure 4:
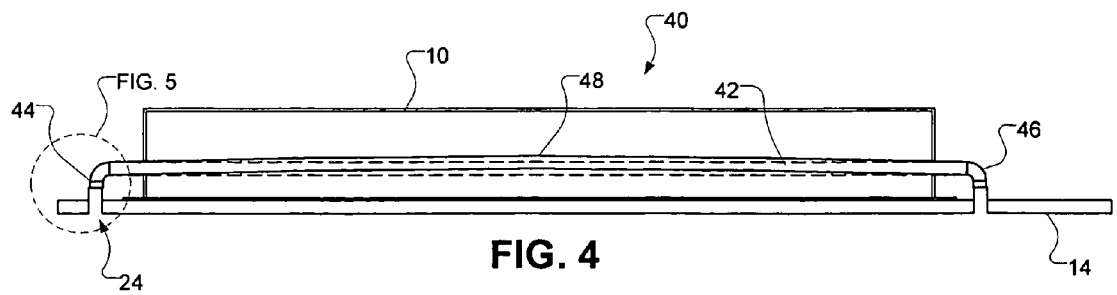
FIG. 4 illustrates a method of attaching the curved, flexible connector to the EMI shield and printed circuit board.
Figure 5:
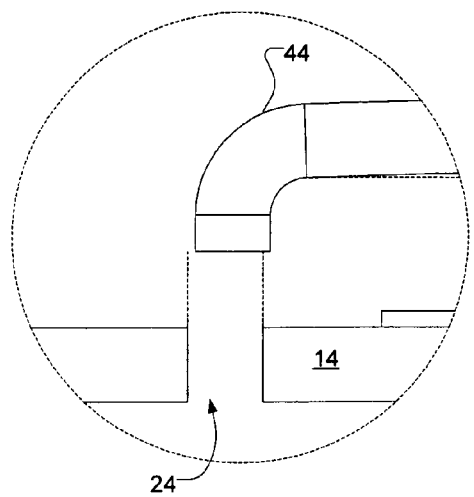
FIG. 5 is a close-up of an end of the curved, flexible connector of FIGS. 3 and 4 and its interaction with an aperture in the printed circuit board.

FIGS. 3 to 5 illustrate another embodiment of the mechanical connectors that are encompassed by the present invention. In the illustrated embodiment, one or more curved connectors 40 are used to couple the EMI shield 10 to the ground trace 12. The curved, flexible connectors 40 comprise an elongate body 42 that has a slight upward curvature away from a surface of the printed circuit board. The ends 44, 46 of the elongate body are sized and shaped to fit within apertures 24 within the printed circuit board 14. The curved flexible connectors 40 may be made out of aluminum, steel, copper, and the like. Alternatively, the curved flexible connectors may be composed of injection molded plastic or extruded plastic. The plastic materials may be a nylon, polypropylene, ABS, polystyrene, PET or similar polymers.

Due to the curvature of the connectors 40, the ends 44, 46 of the connectors curve downward (perpendicular to a top surface of printed circuit board 14) and do not quite line up with the holes 24 in the printed circuit board (see FIGS. 4 and 5). In order to align the ends 44, 46 of the curved bracket with the holes 24 in the printed circuit board, the ends of the flexible connector 40 must be forced outward by pressing downward on or near a center 48 of the connector so as to straighten out the entire connector (as shown by the dotted lines in FIG. 5).

As shown in FIG. 5, once connector 40 substantially straightens out, the ends 44, 46 will align with apertures 24 and the natural spring force as a result of the curvature of the connector 40 will create tension and friction between the ends 44, 46 of the connector and the holes 24 of the printed circuit board. The tension and friction may keep the flexible connector 40 straight and may maintain pressure across the entire flange 18 of the EMI shield 10 and also secure the connector 40 in place. In order to remove the connector and to remove the EMI shield 10 from the printed circuit board, the user merely needs to apply an upward force (e.g., pull up) on the connector 40 and move the connector back to its curved configuration, which will release the tension and friction between the ends 44, 46 and the holes 24.

Figure 6:
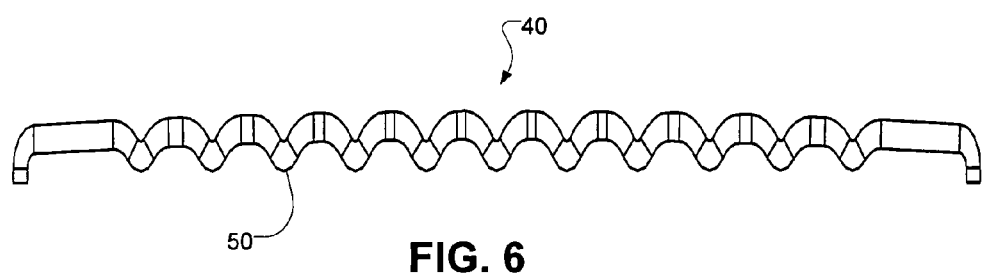
FIG. 6 illustrate an alternative embodiment of a connector that comprises a plurality of contact points along its body.

FIG. 6 illustrates another embodiment of a connector 40 of the present invention. Similar to the embodiments of FIGS. 3-5, the connector 40 shown in FIG. 6 will have a slight curvature, so that upon insertion of ends 44, 46 into holes 24 in the printed circuit board, a friction force and tension force will maintain the EMI shield 10 on the ground trace 12. Additionally, the flexible connector 40 in FIG. 6 has a plurality of contact points 50 over the length of the elongate body. Thus, when flexible connector 40 is straightened, the contact points 50 will contact the flange 18 and apply a substantially even pressure downward into the printed circuit board over the length of flange 18 of the EMI shield. The contact points 50 may be added to the elongate body, or the elongate body may be shaped to have the contact points. For example, the curved connector 40 may be in a serpentine shape and the bottom apices will act as the contact points 50.

Figure 7:
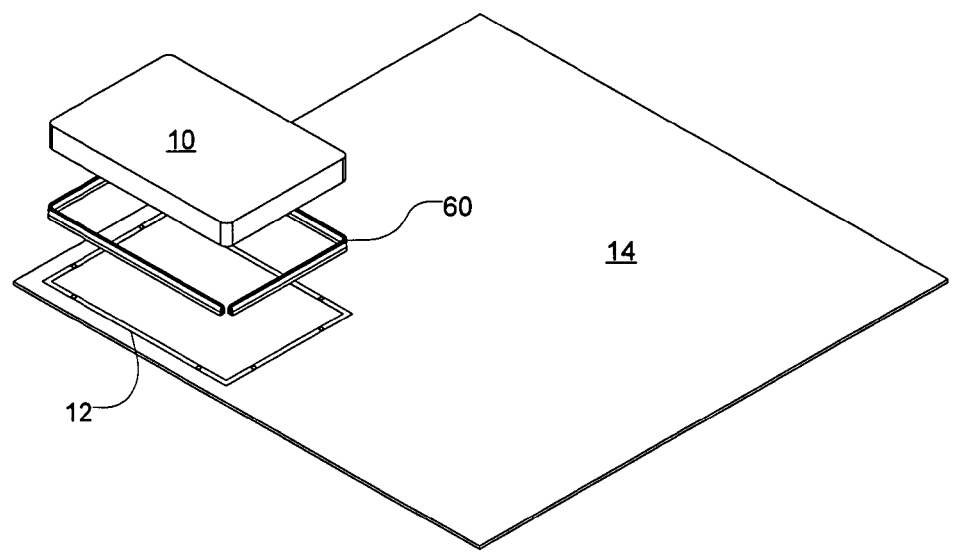
FIG. 7 is a exploded perspective view of mechanical clips that are attached to the printed circuit board which removably couple an EMI shield to a ground trace on the printed circuit board.
Figure 8:
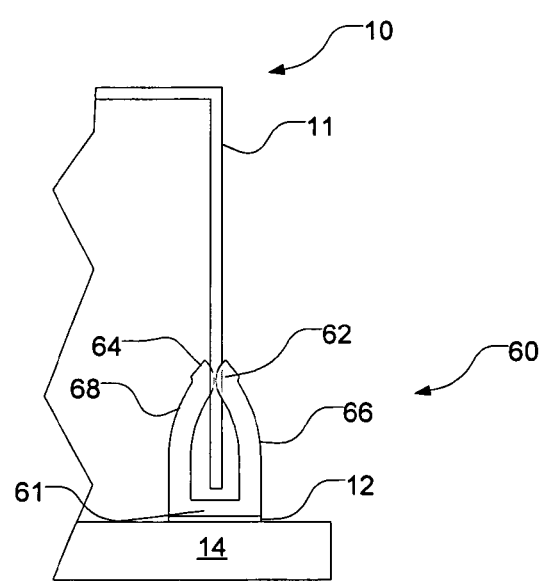
FIG. 8 is a partial side elevational view of a clip of FIG. 7 that couples the EMI shield to the ground trace.

Referring now to FIGS. 7 and 8, the connector of the present invention may have a plurality of clip members 60 that are attached to the ground trace 12, typically with an adhesive or solder (not shown). The clip member 60, may be made from metal and would be soldered onto a printed circuit board in a desired strategic location. The clip member 60 may be designed to receive the sidewalls 11 of an EMI shield 10 and would perform in a similar manner as a paper clip. Portions of the sidewall 11 of the EMI shield would effectively be "pinched" by features 62, 64 on opposing arms 66, 68 of the clip member to retain the EMI shield 10 on the ground trace 12 and also make an electrical grounding connection between the ground trace 12 and the metallized sidewalls 11 of the EMI shield. Such a configuration allows the EMI shield 10 to be repeatedly installed and removed as needed for service or circuitry repair, without damaging the EMI shield or the printed circuit board. Optionally, the EMI shield could have recesses or apertures (not shown) that are configured to receive the features 62, 64 of the clip member.

Figure 9:
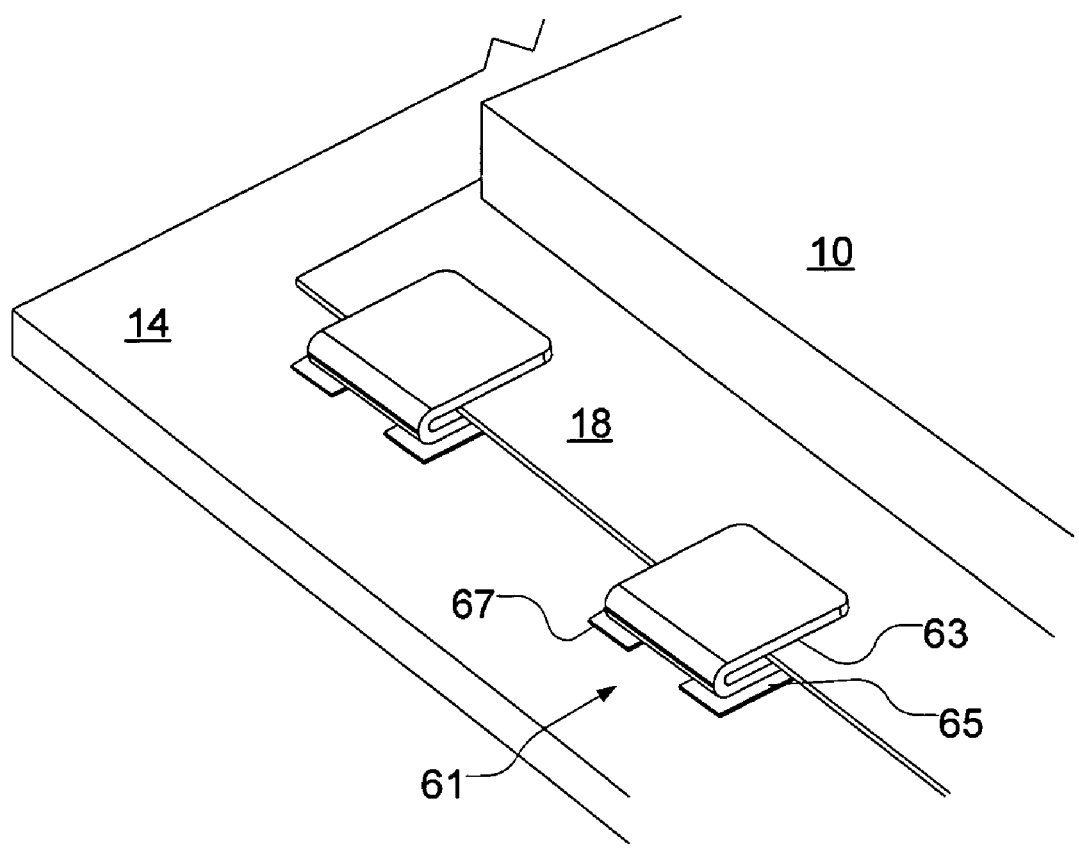
FIG. 9 illustrates another embodiment of the mechanical clips that removably couple the EMI shield to the ground trace.

FIG. 9 illustrates another embodiment of a mechanical connector 61 that is encompassed by the present invention. In this configuration, the mechanical connector 61 may be in the form of a clip that is positioned and configured to mechanically contact a flange 18 on the EMI shield 10. Clip 61 may be of various sizes and shapes and made from a variety of materials, but are usually conductive and comprised of a metal. As can be appreciated, it may be desirable to have clips 61 be formed of a metallized plastic. Clip 61 may comprise an essentially U or C-shaped body that comprises a first and second opposed arms 63, 65 for receiving a portion of the EMI shield 10. Clips 61 are usually directly attached to the ground trace 12, but the clips 61 may be positioned adjacent the ground trace so as to directly contact and ground the metal layer on flange 18 to the ground trace.

Clips 61 may be used to press the electrically conductive surface of the EMI shield 10 against the exposed ground trace of the printed circuit board. If the connectors are conductive and are allowed to be electrically coupled to the ground plane of the printed circuit board, the clips improve shielding effectiveness by being able to more directly connect the second metallized layer on the outside surface of the EMI shield 10 (e.g., side not facing the printed circuit board) to the electrical ground of the printed circuit board. In the illustrated configuration, arm 63 of the conductive connector contacts the second, upper surface of the flange 18 of EMI shield 10 and the opposed arm 65 of the connector makes electrical contact to the ground trace (not shown). Such a configuration provides better grounding of the second metallized surface which would only normally be grounded to the printed circuit board through the continuity of the first metallized surface being electrically connected to the metallized second surface by the metallized edge of the EMI shield.

Clips 61 may be located onto the printed circuit board 14 either by hand placement or by robotic placement similar to other electronic components on the printed circuit board 14. In one embodiment, the clips 61 may be attached to the ground trace (or printed circuit board 14) through an adhesive (not shown). Alternatively, clips 61 may either be soldered by hand or sent through a common surface mount technology (SMT) line, similar to other electronic components on the printed circuit board. On a SMT line, the printed circuit board and the placed electronic components are sent through a reflow oven where the components are soldered into place. As is known in the art, components are placed onto the printed circuit board 14 and onto solder paste to hold the components in place. The solder paste contains solder 67 and flux. Once the solder 67 and component are passed through the reflow oven, the flux evaporates, the solder melts and then the printed circuit board exits the oven where the solder solidifies and creates a mechanical/electrical bond to the printed circuit board 14.

Once the clips are soldered into place, the metallized thermoform EMI shield 10 may be slipped into the clips where the flange 18 of the EMI shield is 10 pinched between the arms 63, 65 to hold the EMI shield 10 in place and make an electrical contact to ground through the clip 61. As can be appreciated, with such a configuration, the EMI shield is removably attached to the ground trace via the clips, and the EMI shield 10 may easily be attached and removed as need so as to access the electrical circuits and components that are positioned within EMI shield 10.

The connectors illustrated in FIGS. 1 to 9 allow for connection and removal of the EMI shield 10 from the printed circuit board 14, independent of the position of the outer enclosure of the electronic device. Thus, the outer enclosure of the electronic device may be removed/detached from the printed circuit board without effecting the shielding provided by the EMI shield.

Figure 10:
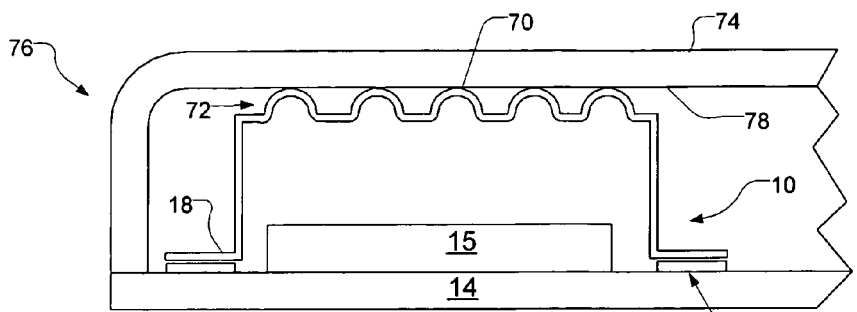
FIGS. 10 and 11 illustrate an EMI shield that is held in place on a printed circuit board through the interaction between features on the EMI shield and an inner surface of an outer housing of the electronic device.
Figure 11:
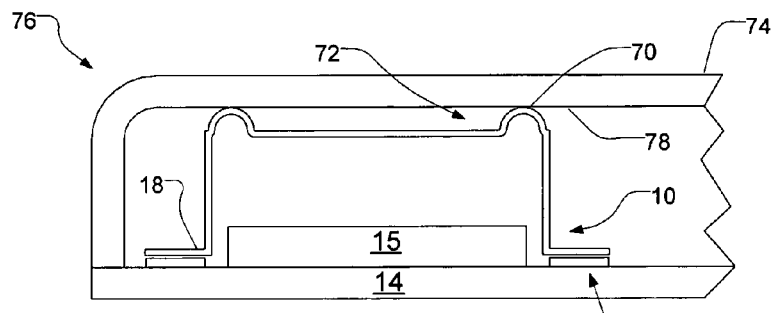

FIGS. 10 and 11 illustrate two additional embodiments for grounding and retaining an EMI shield 10 to a printed circuit board 14. Such embodiments utilize various design features 70 that can be incorporated into a top surface 72 EMI shield during the forming process. The shape and location of the design features 70 is often dependant on design of the printed circuit board and the design of the outer enclosure 74 of the electronic device 76. The design features 70 often have details that are convex and protruding towards an inside surface 78 of the enclosure 74 of the electronic device 76 and away from the printed circuit board 14. The features 70 cause the EMI shield 10 to be dimensionally taller than the available space allowed between the inside of the enclosure and the surface of the printed circuit board. As a result, when the enclosure is closed, the inside surface 78 of the enclosure presses down on the convex features 70 of the EMI shield 10 and compresses the shield against the ground trace 12 of the printed circuit board 14, thereby retaining its position and location against the printed circuit board. The added compressive force also improves the electrical contact pressure between the conductive surfaces (e.g., flange 18) of the EMI shield 10 and any exposed grounding trace 12 on the printed circuit board surface thereby improving the grounding connection and shielding performance of the shield.

The top surface 72 may have features 70 only along selected portions (e.g., adjacent and above vertical sidewall 11 so as to apply more pressure down sidewall 11 and improve the contract pressure between the flange 18 and ground trace 12) (FIG. 11) or the features may be spaced over the entire surface (FIG. 10). If desired, an adhesive may be applied to the flange 18 so as to position the EMI shield 10 on the ground trace.

Figure 12:
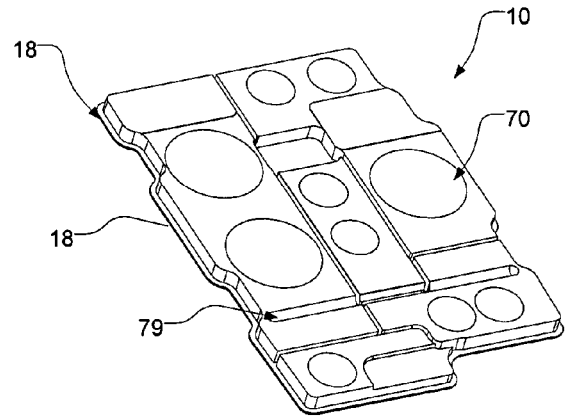
FIG. 12 illustrates a multi-compartment EMI shield having cavities for receiving ribs of an outer housing and semi-circular features along a top surface of the EMI shield that improves compression force of the EMI shield on the printed circuit board

FIG. 12 illustrates a multi-compartment EMI shield 10 that comprises structural details 70 along an outer, top surface 72 that improve the compressive forces caused by the interaction between the EMI shield 10 and an outer housing of the electronic device (e.g., cellular phone). In the illustrated configuration, structural details 70 are in the form of a semicircular feature. Structural details 70 also include cavities 79 that are configured to receive a rib that is attached to the outer housing of the electronic device (See FIG. 17). As can be appreciated, when the outer housing is placed over EMI shield 10, the ribs extend into the cavities 79 such that semicircular feature 70 is in contact with an inner surface of the outer housing. When the outer housing is placed around the printed circuit board (not shown), the ribs and semicircular features 70 act to compress the flange 18 of EMI shield 10 against the ground trace on the printed circuit board. As can be appreciated, in some embodiments, the semi circular features 70 are sufficient to compress the EMI shield 10 against the printed circuit board, and the ribs will not be necessary.

Figure 13:
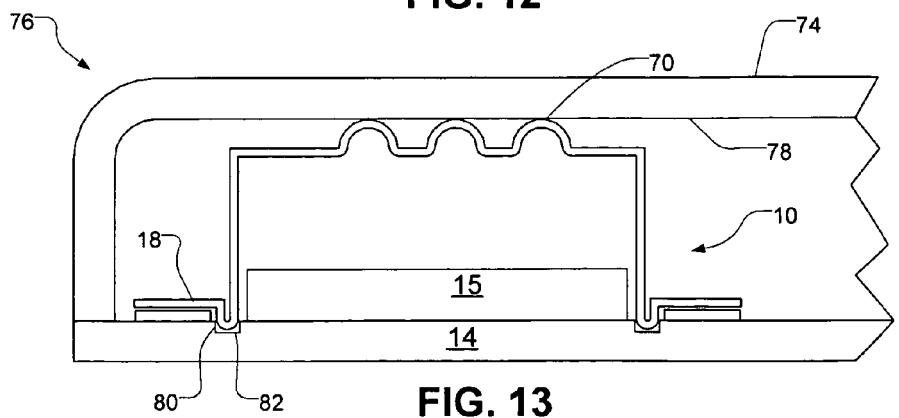
FIG. 13 illustrates male features in an EMI shield that interact with a corresponding female feature (e.g., groove)

As shown in FIG. 13, another embodiment of the present invention involves incorporating male features 80 into EMI shield that contact corresponding female features 82 on the printed circuit board 14 to encourage EMI shield 10 location and retention with the printed circuit board 14 in the electronic device 76.

The feature 80 may be in the form of a bump, boss, protrusions, and the like, and are typically formed integrally with flange 18 on the shield during the forming process (e.g., thermoforming process). In the illustrated embodiment, feature 80 is in the form of an additional bend in the polymer material that creates a protruding ridge that extends around the entire perimeter of the EMI shield 10. As can be appreciated, instead of a continuous protrusion, the EMI shield may include one or more discrete features, and the features 80 may be positioned along the entire flange 18 or the features 80 may be strategically placed over only select portions of the flange 18. The corresponding female feature 18 will generally be positioned in a position that corresponds to the male features. The female features may be a groove, trough, a hole, slots and the like. The female feature 82 may be created by a router or similar mechanical device during the printed circuit board manufacturing process.

In use, the female feature 82 in the printed circuit board may be used as a receptacle and receive the male features 80 of EMI shield and will help position the EMI shield on the printed circuit board. Optionally, features 80 may be used to lock the EMI shield in the grooves. If desired, the female feature 82 may comprise an undercut or dovetail shape so as to pinch the features 80 and improve the ability to retain the EMI shield in place.

Optionally, flange 18 may include an adhesive (not shown) (e.g., conductive, double sided adhesive 16 so as to attach the EMI shield to ground trace 12. Additionally or alternatively, EMI shield 10 may include features 70 along the top surface 72 that are used to interact with the outer enclosure 74 to push the EMI shield against the ground trace 12, as described above in relation to FIGS. 10 to 12.

Another embodiment that comprises features on the flange 18 is shown in FIGS. 14 and 15 where the male and female features 80, 82 resemble a tongue and groove. The groove 82 is in the form of a trough that is fabricated into the surface of the printed circuit board 14. The flange 18 of EMI shield 10 may be integrally formed with one or more protruding "tongues" or boss features 80 that are designed to mate with the groove 82 fabricated in the printed circuit board 14. Utilizing the inherent flexibility and compressibility of the plastic material the shield is made from (polymer), the tongue feature 80 may naturally deform to match the contour and shape of the groove 82. Thus if the shape and size of the grooves 82 are designed to be smaller than the features 80, the deformation of the features should result in sufficient frictional contact between the feature of the shield and the corresponding feature of the printed circuit board to retain the location and position of the shield. Although the tongue and groove example is a specific design feature, it should be appreciated that other design features, common to someone skilled in the art, could be incorporated into the design of the printed circuit board, the shield or both in effort to achieve the same positioning and retention result.

Moreover, instead of having the male features on the EMI shield, the EMI shield may be manufactured to have female features and the male features may be added onto the printed circuit board. In such embodiments, the grooves in the printed circuit board to be similar to plated through holes in a printed circuit board where screws pass through and both secure and ground the printed circuit board. These plated holes are thru holes that are electrically coated with the same ground trace material and are electrically connected to the ground plane of the printed circuit board. For our grooves, the grooves could go through a particular depth of the printed circuit board or pass all the way through the printed circuit board in periodic locations in order to provide enough of an aperture to allow the tongue of our shield to make electrical contact with the plated surface of the groove. The details would be small, but we are capable of forming small details into our shields as well.

FIG. 16 illustrates yet another embodiment encompassed by the present invention. In this configuration, a printed circuit board 14 will be sandwiched between either a 2-piece or a living hinge clam shell shield. In the illustrated embodiment, a male snap feature 83 or boss may be integrally formed or attached to a a flange 84 of first shield 85 and a female snap feature 86 will be integrally formed or attached to a flange 87 of a second shield 88. The male snap feature may be pressed upward, through an aperture 89 in the printed circuit board 14 and will protrude past through to the other side of the printed circuit board 14. The protrusion of the male snap feature 83 will simultaneously engage with the female snap feature 86 as the other half of the shield is brought downward agains the printed circuit board 14.

The male and female snap features 83 may mechanically hold the 2 shield halves 85, 88 together through a mechanical interference fit. The severity of the interference fit can be varied through the design of the snap feature. If more or less interference is desired, the diameter of the male (or female) snap features can be increased or decreased accordingly.

As can be appreciated, in alternative embodiments, the two-part shield may be sized and shaped so that the EMI shield extends beyond the edge of the printed circuit board so that the male and female snap features 83, 86 are configured to snap together outside the perimeter of the printed circuit board so as to effectively sandwich the printed circuit board between the two shield halves.

In yet other embodiments, both the first shield 85 and second shield 88 may have male snap features (not shown) that are configured to align with different apertures in the printed circuit board. Alternatively, both the first shield 85 and second shield 88 may have female snap features that align with different male protrusions or standoffs that extend from a surface of the printed circuit board.

Optionally, the inner diameter of the aperture 89 in the printed circuit board may be plated or otherwise made conductive and connected to a ground plane on the printed circuit board. In such embodiments the male snap feature may also provide an electrical connection to the ground plane of the printed circuit board which is desirable for effective EMI shielding.

While the illustrate embodiment illustrates only a single pair of male and female snap features 83, 86, as can be appreciated, the shields may incorporate as many snap features as desired. For example, the snap features may only be positioned at the corners of the printed circuit board. Alternatively, the snap features may be disposed along selected portions of the perimeter (or anywhere along the surface of the printed circuit board).

Referring now to FIG. 17, in embodiments of the EMI shield 10 which have cavities to receive a rib 98 from the outer housing of the electronic device, a gasket 96 may be placed in cavity 94 in between the rib 98 and the EMI shield 10. The gasket 96 increases the contact pressure that the EMI shield 10 makes with the ground trace 12 on the printed circuit board 14. As can be appreciated, a higher contact pressure impress the electrical connection. A more complete description of suitable gaskets and other EMI shield may be found in commonly owned U.S. patent application Ser. No. 09/685,969, field Oct. 10, 2000 (now abandoned), the complete disclosure of which is incorporated herein by reference.

FIG. 18 illustrates an embodiment in which outer enclosure 74 includes locators 100. Locators 100 are configured to interact with portions 102 of the EMI shield so that the relative position between the outer enclosure 74 and EMI shield 10 is maintained. The locators 100 may be protrusions, recesses, or other features that mate with a corresponding portion 102 of EMI shield. In the illustrated embodiment, the EMI shield comprises optional support ribs 104 that may provide structure support to EMI shield 10. Alternatively, support ribs 104 may correspond to the cavity 94 that is shown in FIG. 15, so as to receive ribs (not shown) from the outer enclosure 74.

Locators 100 and portions 102 may have a friction or interference fit to hold the EMI shield 10 in place relative to the enclosure 74. Such an interaction allows for easy removal of the EMI shield and thus improves the recyclability of the end use product. Alternatively, droplets of adhesives could be placed in the shield locators 102 prior to attaching the EMI shield 10 to the enclosure 74. In such embodiments, the locators 100 would not require a friction fit as the adhesive would hold the shield in place. As can be appreciated, locators 100 may be used with any of the other embodiments that are encompassed by the present invention.

FIG. 19 illustrates a kit that is encompassed by the present invention. Kit 110 includes an EMI shield 112 and a connector(s) 114. EMI shield 112 may be any of the EMI shield described herein or it may be any conventional EMI shield known in the art. The EMI shield 112 will be configured to be usable with connector(s) so as to allow attachment to a printed circuit board. Connector(s) 114 may be any of the connector's described herein. Connectors 114 may be integrally formed in the EMI shield, removably attachable to the EMI shield, and/or fixedly attachable to the ground trace on the printed circuit board.

Kit 110 may also include instructions for use 116 which recite any of the methods described herein. Instructions for use, EMI shield 112 and connector(s) 114 may be held in packaging 118. Packaging 118 may be any conventional packaging, including pouches, trays, boxes, tubes, or the like. The instructions for use 116 will usually be printed on a separate piece of paper, but may also be printed in whole or in part on a portion of the packaging 118.

While particular forms of the invention have been illustrated and described, it will be apparent that various modifications can be made without departing from the spirit and scope of the invention. For example, while the above attachment assemblies are illustrated as separate from each other, it should be appreciated that any of the attachment assemblies of the present invention are not mutually exclusive, and any of the embodiments may be combined with each other. For example, a combination of adhesive and one or more connectors 20, 40 (FIGS. 2 and 3) may allow for easy access to underlying electronic components while still maintaining the location of the EMI shield. Moreover, while the EMI shields of the present invention are typically in the form of a metallized thermoform, other types of EMI shields—such as conventional metal cans, or conductive polymers—may be used with the connectors of the present invention.

What is claimed is:

1. An electronic device comprising:
   a printed circuit board comprising an electronic component and a grounding portion;
   an electromagnetic interference (EMI) shield comprising a top surface that includes both a flat portion and one or more features that extend above the flat portion, a plurality of sidewalls that extend from the top surface, and a flange that extends in a direction substantially parallel to a surface of the printed circuit board; and
   a housing of the electronic device configured to enclose the printed circuit board and EMI shield,
   wherein the features on the top surface of the EMI shield contact an inner surface of the housing so as to compress the flange of the EMI shield against the grounding portion on the printed circuit board while the flat portion of the top surface does not contact the inner surface of the housing.

2. The electronic device of claim 1 wherein the EMI shield comprise a metallized, shaped polymer substrate.

3. The electronic device of claim 1 wherein the features compose semi-circular protrusions that extend toward the inner surface of the housing.

4. The electronic device of claim 1 wherein the features are positioned substantially over the sidewalls.

5. The electronic device of claim 1 wherein the EMI shield further comprises a one or more features that extend from the flange toward the printed circuit board, and the printed circuit board comprises a corresponding feature that mates with the feature on the EMI shield to locate and retain the EMI shield with the grounding portion.

6. The electronic device of claim 5 wherein the feature on the flange of the EMI comprises a protrusion and the feature on the printed circuit board comprises a groove.

7. The electronic device of claim 5 wherein the feature on the printed circuit board is positioned adjacent the grounding portion.

8. An electromagnetic interference (EMI) shield comprising:
   a body comprising a top surface that includes both a flat portion and one or more features that extend above the flat portion, a plurality of sidewalls that extend from the top surface, and a flange that extends laterally away from the sidewalls;
   wherein the features on the top surface of the EMI shield are shaped to contact an inner surface of a housing of an electronic device when the housing is positioned around the printed circuit board so as to-compress the flange against a grounding portion on the printed circuit board; and
   wherein the flat portion of the top surface of the EMI shield is shaped to not contact the inner surface of the housing of the electronic device when the housing is positioned around the printed circuit board so as to-compress the flange against the grounding portion on the printed circuit board.

9. The EMI shield of claim 8 wherein the body comprises a metallized polymer.

10. The EMI shield of claim 8 wherein the features comprise semi-circular protrusions that extend in a direction away from the flange.

11. The EMI shield of claim 8 wherein the features are positioned substantially over the sidewalls.

12. The EMI shield of claim 8 wherein the EMI shield further comprises a one or more features that extend from the flange away from the top surface, the features on the flange being configured to interact with a corresponding feature to locate and retain the EMI shield with the grounding portion.

13. The EMI shield of claim 12 wherein the feature on the flange of the EMI comprises a protrusion and the feature on the printed circuit board comprises a groove.

14. An electronic device comprising:
   a printed circuit board comprising an electronic component and a grounding portion;
   an electromagnetic interference (EMI) shield comprising a top surface that includes both a flat portion and one or more features that extend above the flat portion, a plurality of sidewalls that extend from the top surface, and a flange that extends in a direction substantially parallel to a surface of the printed circuit board; and
   a housing of the electronic device configured to enclose the printed circuit board and EMI shield;
   wherein the features on the top surface are dimensionally taller than the space formed between the inside of the housing and the flat portion of the EMI shield when the housing is brought into contact with the EMI shield; and
   wherein the features on the top surface of the EMI shield contact an inner surface of the housing so as to compress the flange of the EMI shield against the grounding portion on the printed circuit board while the flat portion of the top surface does not contact the inner surface of the housing.

15. The electronic device of claim 14 wherein the features have a convex shape that protrude towards the inner surface of the housing.

16. The electronic device of claim 14 wherein the features are positioned to apply a force downward along the plurality of sidewalls.

17. The electronic device of claim 16 wherein the features are positioned adjacent and above the plurality of sidewalls.

18. The electronic device of claim 14 wherein the features are spaced over the entire top surface.

19. The electronic device of claim 14 further comprising an adhesive applied to the flange so as to position the EMI shield on the grounding portion on the printed circuit board.

* * * * *